United States Patent [19]
Kim et al.

[11] Patent Number: 5,293,559
[45] Date of Patent: Mar. 8, 1994

[54] SEMICONDUCTOR MEMORY DEVICE HAVING NETLIKE POWER SUPPLY LINES

[75] Inventors: Hyun-Soo Kim, Suwon; Yong-Sik Seok, Taegu, both of Rep. of Korea

[73] Assignee: Samsung Electronics Co., Ltd., Suwon, Rep. of Korea

[21] Appl. No.: 770,241

[22] Filed: Oct. 3, 1991

[30] Foreign Application Priority Data

Aug. 1, 1991 [KR] Rep. of Korea ............... 1991-13298

[51] Int. Cl.$^5$ ............................................. H01L 27/10
[52] U.S. Cl. ........................................ 365/63; 365/51; 365/226; 257/207
[58] Field of Search .................... 365/63, 51, 52, 226, 365/230.04, 227, 230.06; 357/45, 68; 257/206, 207, 208

[56] References Cited

U.S. PATENT DOCUMENTS

| | | | |
|---|---|---|---|
| 4,989,062 | 2/1991 | Takahashi et al. | 257/207 |
| 5,012,443 | 4/1991 | Ema | 365/63 |
| 5,072,425 | 12/1991 | Kohno et al. | 365/63 |

FOREIGN PATENT DOCUMENTS

| | | | |
|---|---|---|---|
| 63-81971 | 4/1988 | Japan | 257/207 |
| 3-27529 | 2/1991 | Japan | 257/207 |

*Primary Examiner*—Eugene R. LaRoche
*Assistant Examiner*—Vu A. Le
*Attorney, Agent, or Firm*—Robert E. Bushnell

[57] ABSTRACT

A semiconductor memory device for minimizing the resistance attendant on reaching as far as each sense amplifier connected to a memory cell. A first plurality of power supply lines are alternatively disposed between column select lines which is formed over a plurality of lines of semiconductor memory device in a column direction. The first plurality of power supply lines the first plurality of ground lines are connected to a second plurality of power supply lines and a second plurality of ground lines which are disposed under the column select lines in a row direction, to thereby provide a netlike power supply structure. Consequently, the operating speed of a chip is improved by minimizing the resistance attendant on reaching as far as the sense amplifiers connected to each memory cell and the efficiency of the semiconductor memory device is greatly promoted by suppressing a coupling phenomenon caused between the column select lines.

17 Claims, 7 Drawing Sheets

SEMICONDUCTOR MEMORY DEVICE HAVING NETLIKE POWER SUPPLY LINES

BACKGROUND OF THE INVENTION

The present invention relates to a semiconductor memory device and particularly to a method for arranging power supply lines which are laid out so as to ensure that each memory element conducts sensing operations at high speed.

The more highly a semiconductor memory device is integrated, the greater the problem achieving high-speed operations. It is widely known in this field that sensing operations of a bit line must be conducted at a high speed rate for high-speed operations of a chip. However, the more highly a semiconductor memory device is integrated, the chip increases in size and a metal layer covering a memory array decreases in width. This causes its metal wiring resistance to grow and results in lowering its high-speed operations. Particularly, the resistance of the power supply lines which are connected between memory cells and a power supply voltage terminal and a ground voltage terminal is great considerably, and it is so directly related to lowering sensing speed that the study of the power supply line layout is now prosecuted earnestly.

The conventional memory array power supply line layout is illustrated in FIGS. 1A to 1D.

FIG. 1A takes a 1-Mega dynamic random access memory (DRAM) as an example. The memory is divided into a memory cell array area 10 and a periphery area 10'. A pull-up driver 2 for sensing is connected to a Vcc-pad to which a power supply voltage is applied; and a pull-down driver 1 for sensing is connected to a Vss-pad to which a ground voltage is applied. A plurality of memory cell sensing blocks 5 are in the memory cell array area 10, and the Vcc-pad and the Vss-pad are connected to the memory cell sensing blocks 5. In this case, a line connected to the Vcc-pad is called the power line and a line connected to the Vss-pad is called the ground line. The power and ground lines are commonly called the power supply line.

FIG. 1B takes a 4-Mega DRAM as an example. The memory is similar to FIG. 1A, having one difference from FIG. 1A in that the pull-down drivers for sensing 11, 12 are disposed in each sense amplifier within the memory cell array area 20.

FIG. 1C takes a 16-Mega DRAM as an example. Pull-up and pull-down drivers for sensing are within the memory cell array area. It is aptly shown in FIG. 1C which is a partially detailed view of block 18 in FIG. 1D. A column select line CSL for selecting a given corresponding column, a word line strap area are shown in FIG. 1C.

Now, the characteristics of FIGS. 1A to 1D will be described hereinafter.

In the case of 1-Mega DRAM in FIG. 1A, the pull-up and pull-down drivers 2, 1 for sensing are disposed in the periphery area 10' so that the power and ground lines 4, 3 respectively have a considerable amount of resistances R1, R2 and R3, R4 in the memory cell array area 10.

In the case of 4-Mega DRAM which is improved from the 1-Mega DRAM, as illustrated in FIG. 1B, a pull-up driver 13 for sensing is disposed in a periphery area 20' and the pull-down drivers 11, 12 for sensing is disposed in each sense amplifier within the memory cell array area 20 but, as a power line is and a ground line 14 respectively connected to each driver 11, 12 are each a single path, there is a limit in reducing resistances R5, R7, R8, . . . , etc.

In the case of 16-Mega DRAM as illustrated in FIGS. 1C and 1D, since a pull-up and pull-down drivers 22, 21 for sensing separately is disposed in each word line strap area (which is possible because the width of word line strap area becomes relatively larger by a improvement of design rule), resistance between each sense amplifier 23 and the pull-up and pull-down drivers 22, 21 for sensing is thereby reduced to a considerable degree. However, as it is possible to connect the pull-up and pull-down drivers 22, 21 for sensing to each power supply line only in the word line strap area where there are several power supply lines, there is a limit in reducing total resistance. As illustrated in FIG. 1D, the column select lines CSL which select a column of memory cell within block 17 are so situated as to be adjacent to each other that it leads to erroneous operations by causing a coupling phenomenon between the column select lines CSL.

SUMMARY OF THE INVENTION

It is therefore an object of the present invention to provide a method for arranging power supply lines in which resistance thereof is minimized during sensing operation of a memory device.

It is another object of the present invention to provide a semiconductor memory device for preventing a coupling phenomenon occurring between column select lines formed on a semiconductor substrate.

According to an aspect of the present invention, a plurality of bit lines and a plurality of word lines are formed in a column and row directions of memory cell array, and a plurality of column select lines are formed in column direction of the memory cell array over said plurality of bit lines. A first and second power supply lines respectively connected to a power supply voltage terminal and a ground voltage terminal, are alternatively disposed between said column select lines.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1A:
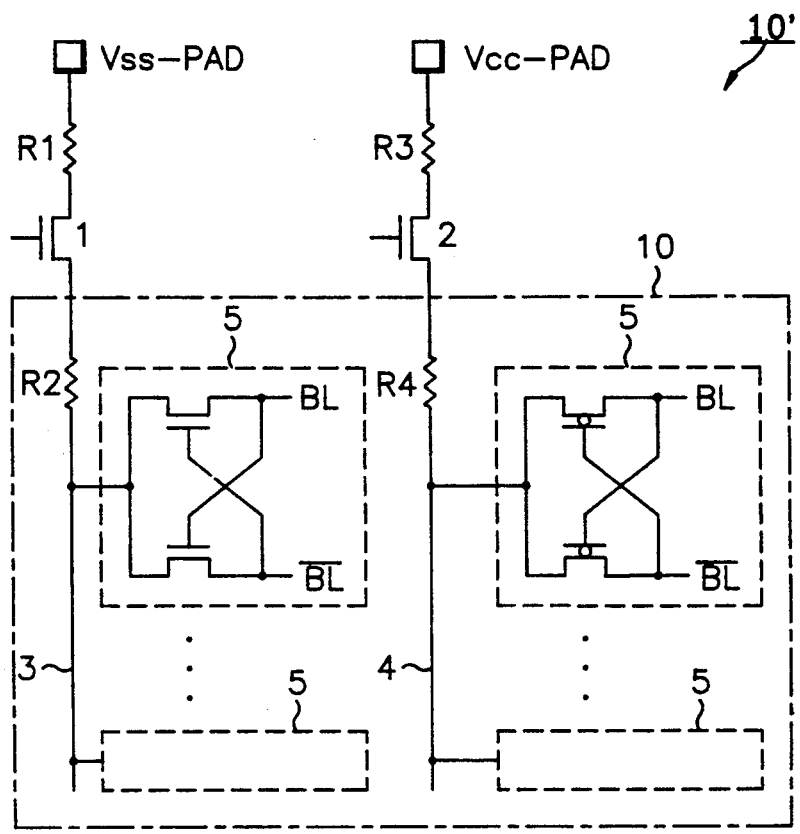
FIG. 1A to 1C are embodiments of the conventional memory cell array.
Figure 1B:
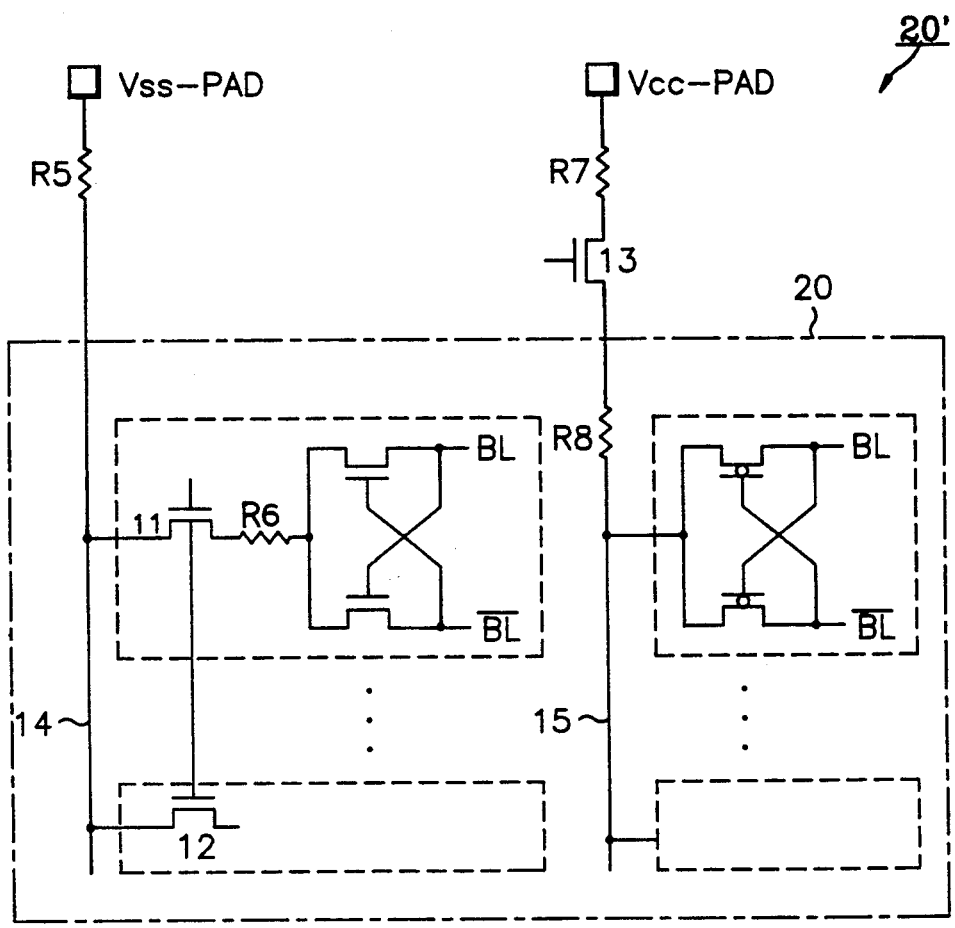
Figure 1C:
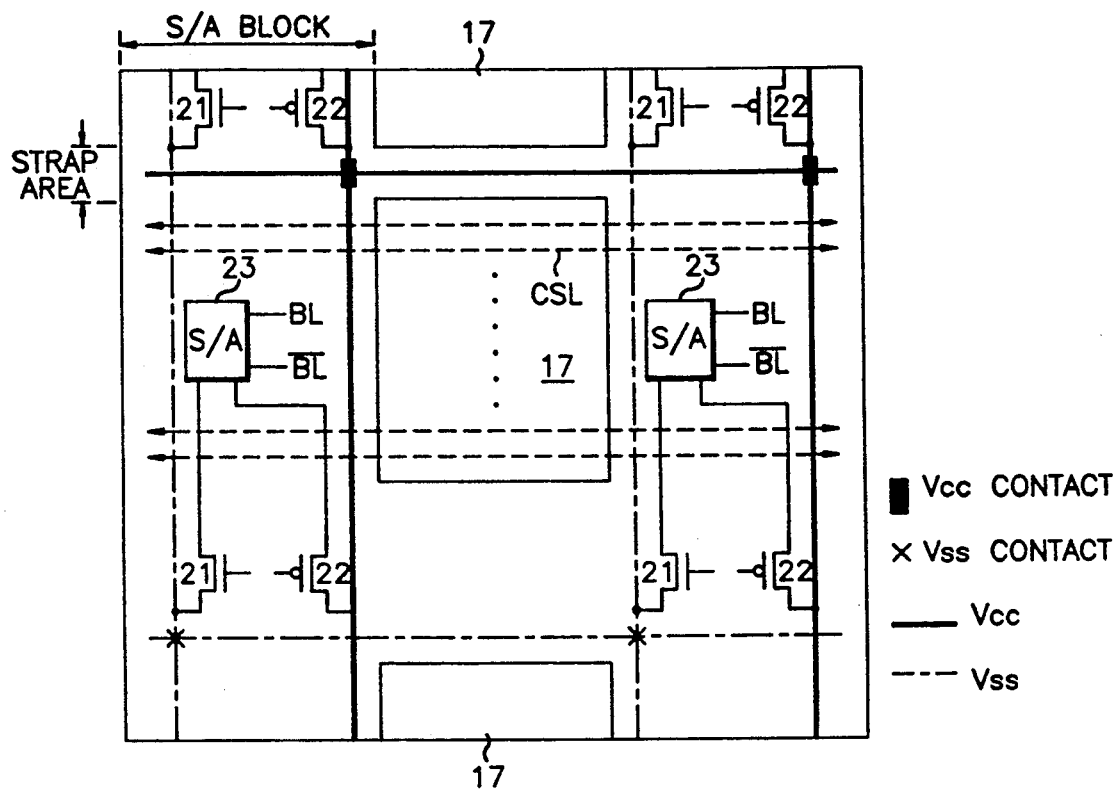
Figure 1D:
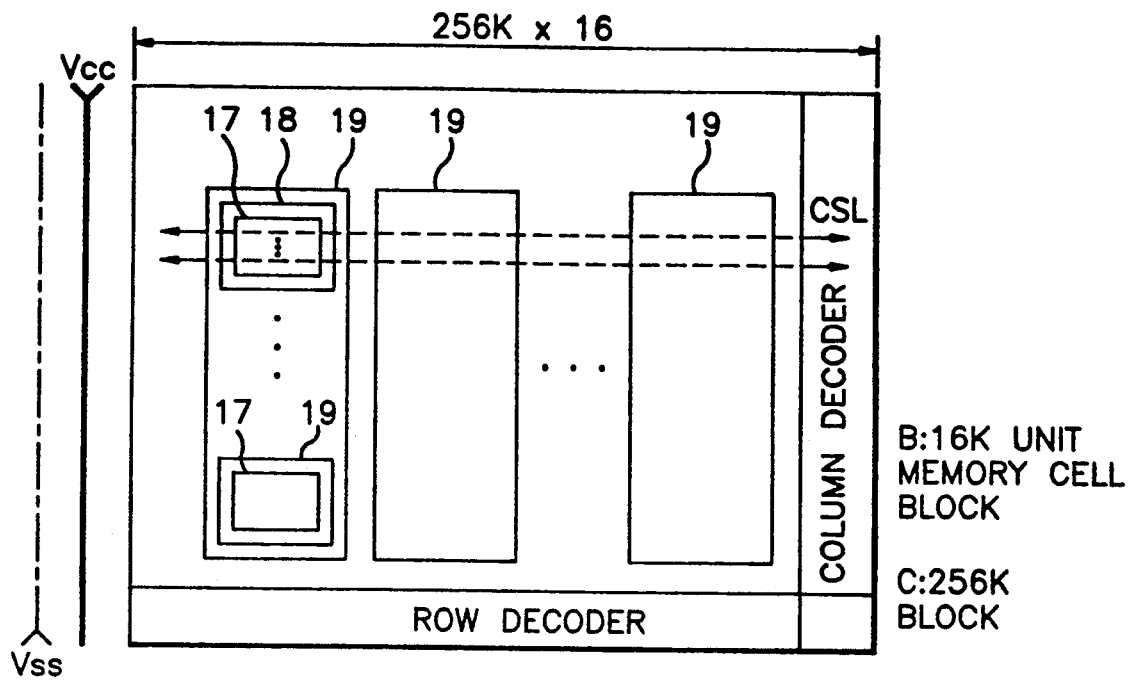
FIG. 1D is a partially detailed view of FIG. 1C.
Figure 2:
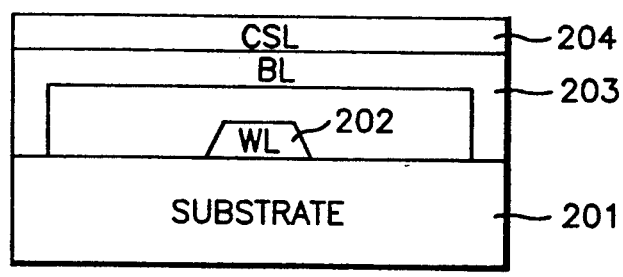
FIG. 2 is a simplified sectional view of a general semiconductor memory device.
Figure 3A:
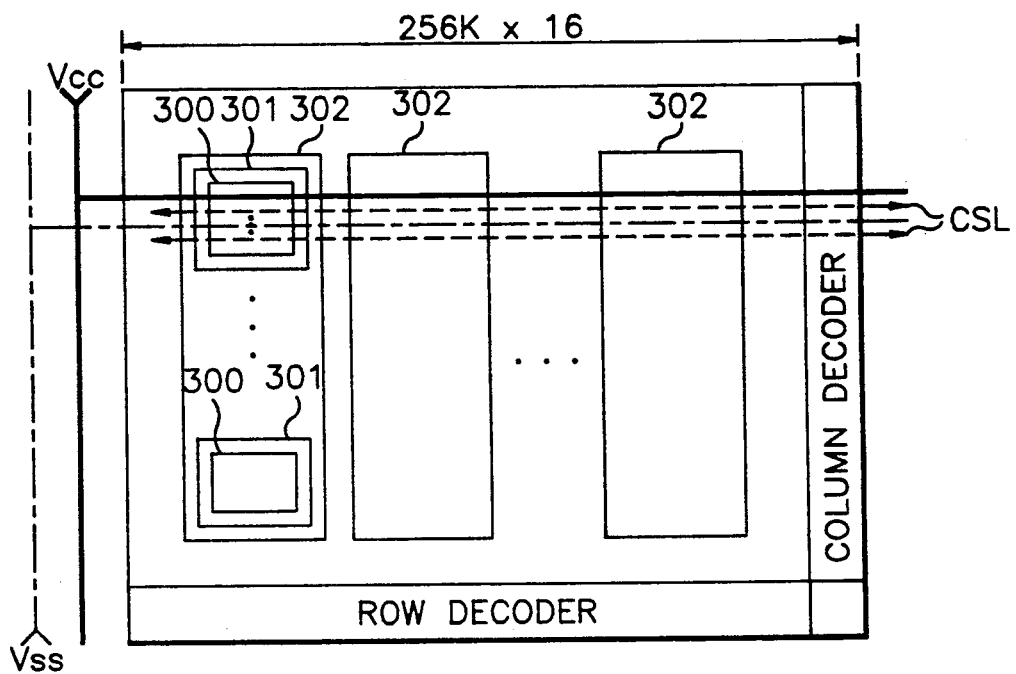
FIG. 3A is a circuit diagram of a memory cell array having netlike power supply lines according to the present invention.
Figure 3B:
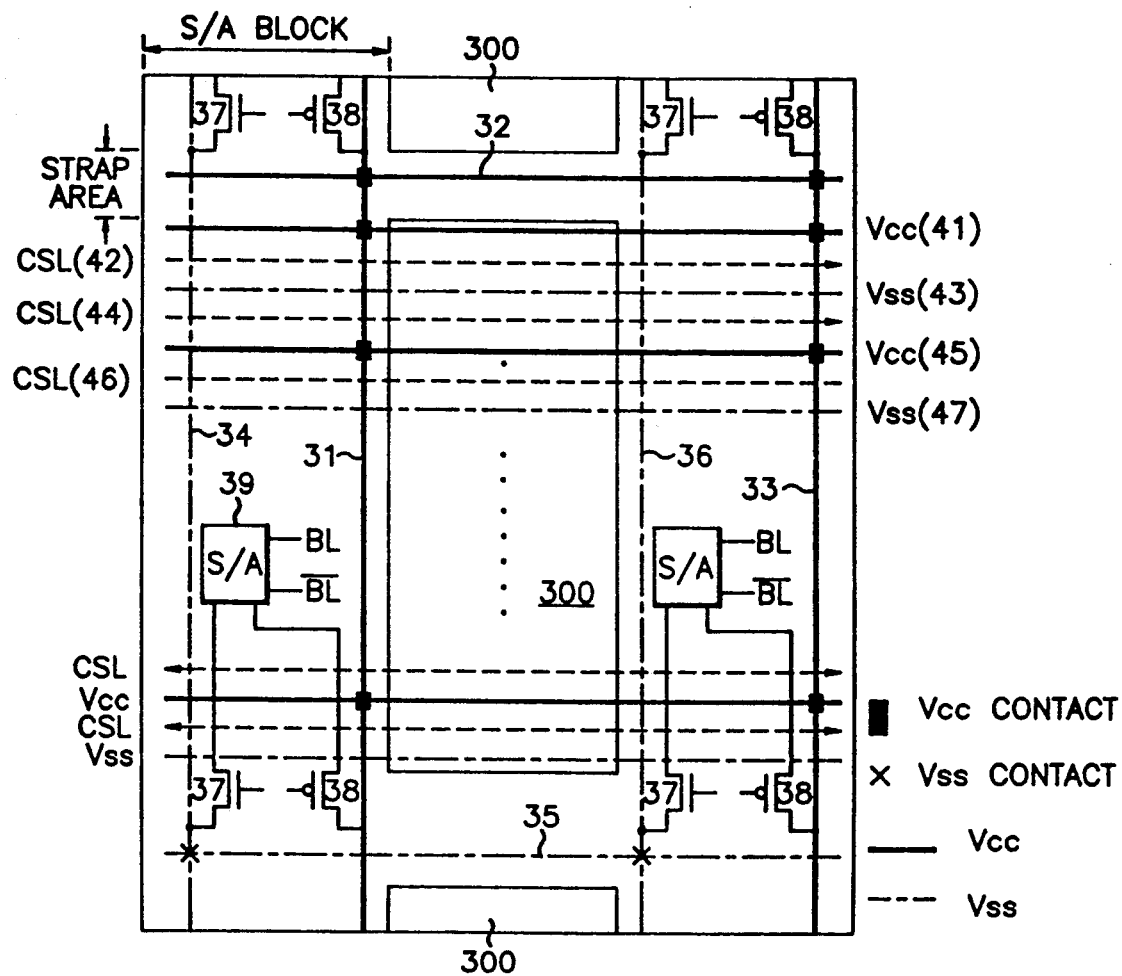
FIG. 3B is a partially detailed view of FIG. 3A.

A method for arranging power supply lines according to the present invention is illustrated in FIGS. 2 to 3B.

Referring to FIG. 2, it is a simplified sectional view of a semiconductor memory device disclosed to help understand the present invention. It is a style known as the usual structure. As illustrated, memory cells and sense amplifiers, etc. are formed on a semiconductor substrate 201, a layer 202 is formed of word lines in the row direction of memory cell on the substrate. A layer 203, being insulated from the layer 202, is formed on substrate of bit lines in the column direction which is made of a thing like polysilicon. A layer 204 is formed of column select lines and power supply lines according to the present invention, in column direction of the memory cell.

Referring to FIG. 3A, a power line connected to the Vcc-pad and a ground line connected to the Vss are alternately disposed between the column select lines CSL. Although the present invention is not illustrated in FIG. 3A, it should be borne in mind that the present invention is applicable even to those DRAMs more than 64-Mega. In the case of 64-Mega DRAM, the block 302 of FIG. 3A indicates 512-kilo blocks and the block 301 indicates memory cell blocks of 32-kilo. It should be understood that the present invention takes a DRAM as an example but other memory element can also be included in the category of the present invention.

Now, the method for arranging power supply lines according to the present invention will be described in detail by referring to FIG. 3B which illustrates the block 301 of FIG. 3A in detail.

As illustrated in FIG. 3B, when a semiconductor memory device is integrated, the width of word line strap area becomes relatively larger due to an improved design rule; and the number of word line strap area is increased. Thus, sizes of a pull-up and pull-down drivers 38, 37 required by a sense amplifier 39 for sensing can be sufficiently larger in the area where a sense amplifier block and a word line strap area cross each other. Power lines 31, 32, 33 and ground lines 34, 35, 36 which are located in the outside of block 300 are according to the prior art. Power lines 41, 45, ... and ground lines 43, 47, ... which cross the block 300 are according to the present invention. The power lines 41, 45, ... and the ground lines 43, 47, ... are alternatively disposed between column select lines 42, 44, 46, ... in the same direction as the column select lines 42, 44, 46, ..., and respectively connected to the power lines 31, 32, 33 and the ground lines 34, 35, 36. Here, it should be understood that the power lines 31, 32, 33 and the ground lines 34, 35, 36 are existent between the substrate and layer 204 of FIG. 2 and that the power lines 41, 45, ... and ground lines 43, 47, ... according to the present invention are disposed on the layer 204 of FIG. 2. Accordingly, it can be easily understood by those who have a usual knowledge in this field that the power supply lines according to the present invention and the existing power supply lines can be connected between the substrate and layer 204 of FIG. 2 and that it can be easily brought to realization. Moreover, the power supply lines according to the present invention are respectively connected directly to the pull-up and pull-down transistors which drive each sense amplifier connected to the memory cells, to thereby minimize each resistance attendant on sensing operations.

Referring to FIG. 3B, in the column direction of memory cell array (in parallel with bit lines), the power supply lines for sensing 41, 45, ... and the ground lines for sensing 43, 47, ... which run in the direction of bit lines are located on the layer 204 of FIG. 2 in the form of having the column select lines CSL 42, 44, 46, ..., therebetween, that is, the lines are disposed in the order of Vcc - CSL - Vss - CSL - Vcc - CSL - Vss - CSL ..

. In the row direction of the memory cell array (in parallel with word lines), the power supply lines 31, 33, ... and the ground lines 34, 36, ... which connect to one another the pull-up and pull-down drivers 38, 37 located in the place where the word line strap area and sense amplifier block cross each other, are situated at the lower portion of the layer 204 of FIG. 2, and the power supply lines are in the form of netlike structure. Consequently, since the sense amplifier block located in a very long distance from the Vcc-pad and Vss-pad of the chip receives power supply through the netlike structure, the resistance until it reaches the sense amplifier block is remarkably reduced, to thereby perform sensing operations at a high rate of speed. When the present invention is actually applied to a 64-Mega DRAM, the resistance has the value of about 3Ω (Ohm) and sensing operation is also accelerated to have a response time of 5 nano-second. Moreover, a coupling phenomenon heretofore caused between the neighboring column select lines is also preventable by arranging power supply lines between the neighboring column select lines in the present invention.

Figure 4:
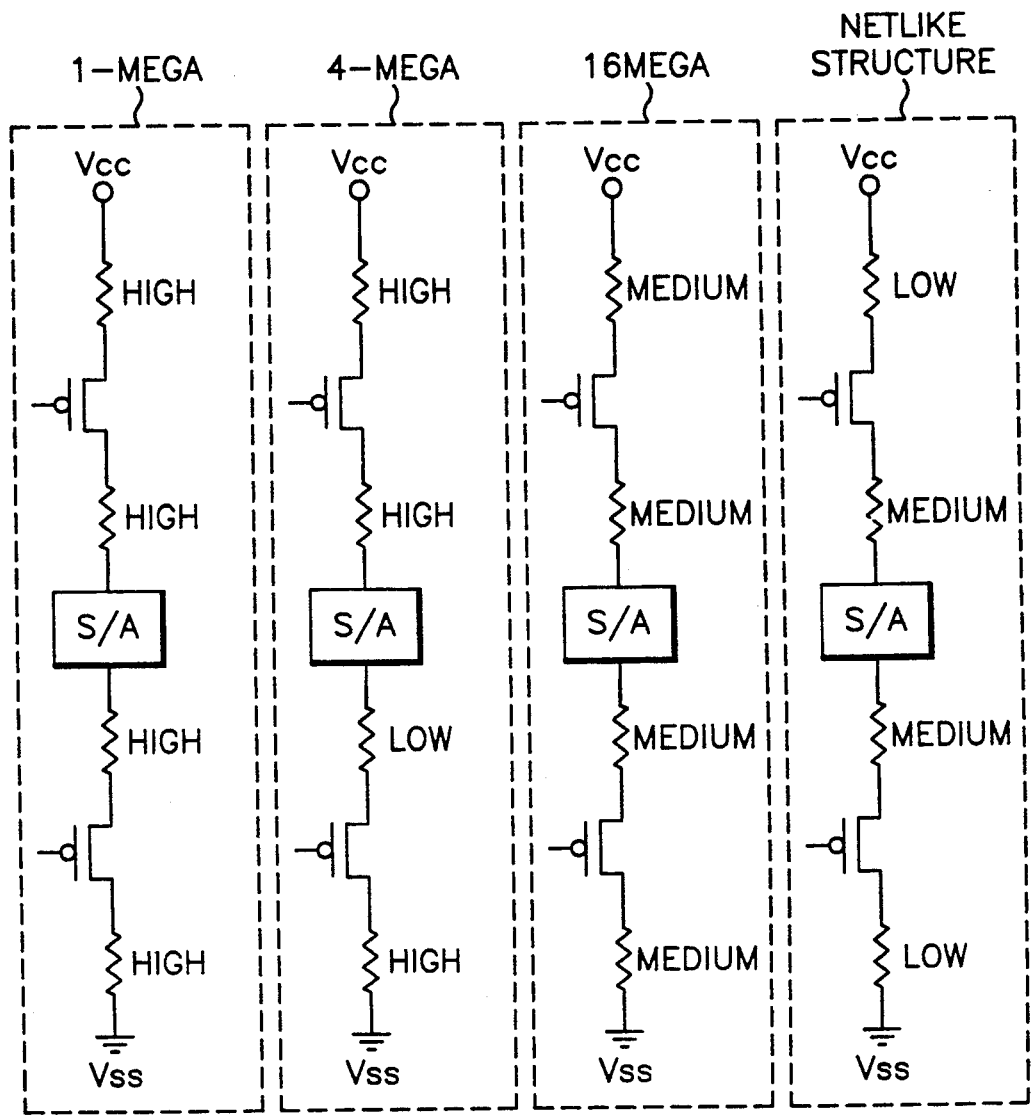
FIG. 4 is a conceptional circuit diagram of the present invention.

To help understand the present invention, conceptional circuit diagrams according to the conventional semiconductor memory device and the present invention are illustrated in FIG. 4. As illustrated, it can be seen that resistance caused until it reaches the sense amplifier from the Vcc and Vss in the DRAM of netlike structure is remarkably reduced as compared with those of 1-Mega, 4-Mega and 16-Mega DRAMs.

In FIG. 3B, it is illustrated in the order of Vcc - CSL - Vss - CSL - Vcc - CSL ... from the top, but it should be understood that the effect of the present invention can be produced even when it is illustrated in the order of Vss - CSL - Vcc - CSL - Vss - CSL ... and that it is included in the idea of the present invention to arrange power supply lines in the order of Vcc - CSL - Vss - CSL - Vss - CSL - Vcc - CSL ...

As heretofore described, the present invention improves the total operating speed of a chip by minimizing the resistance caused while it reaches a memory element and prevents the chip from operating erroneously due to a coupling phenomenon produced between column select lines. Moreover, the present invention makes it possible to be laid out in an empty space over the memory cell without effecting an increase in chip area.

While the invention has been particularly shown and described with reference to a preferred embodiment, it will be understood by those skilled in the art that modifications in detail may be made without departing from the spirit and scope of the invention.

What is claimed is:

1. A semiconductor memory device, comprising:
   a plurality of bit lines arranged in a first direction;
   a plurality of word lines arranged in a second direction;
   a plurality of column select lines arranged in parallel with said plurality of bit lines in said first direction and formed over said plurality of bit lines; and
   a plurality of first and second power supply lines arranged in parallel with said plurality of column select lines in said first direction, each one of said first and second power supply lines being alternatively disposed between said column select lines.

2. The semiconductor memory device according to claim 1, wherein said first and second power supply lines are respectively connected to a power supply voltage terminal having a first potential and to a ground voltage terminal having a second potential.

3. The semiconductor memory device according to claim 1, wherein said first and second directions are substantially perpendicular to each other.

4. A semiconductor memory device having a memory cell array divided into a plurality of blocks, comprising:
   a plurality of first power supply lines being disposed in a predetermined direction;
   a plurality of second power supply lines being disposed in parallel and between said first power supply lines in said predetermined direction; and
   a plurality of column select lines, each being respectively disposed between the first and second power supply lines in said predetermined direction.

5. The semiconductor memory device according to claim 4, wherein said predetermined direction is a column direction of the memory cell array.

6. A semiconductor memory device having a memory cell array divided into a given number of first blocks in a row direction, each of said first blocks being divided into a given number of second blocks in a column direction, comprising:
   a plurality of first and second power supply lines being alternately disposed between said second blocks in said column direction;
   a plurality of column select lines being disposed over said second blocks in the row direction; and
   a plurality of third and fourth power supply lines, each one of the third and the fourth supply lines being disposed between said column select lines in said row direction, and respectively connected to the first and second power supply lines.

7. The semiconductor memory device according to claim 6, wherein said first and third power supply lines are connected to a power supply voltage terminal having a first potential, and said second and fourth power supply lines are connected to a ground voltage terminal having a second potential.

8. A method for fabricating a semiconductor memory device having a netlike power supply lines structure, comprising the steps of:
   forming a plurality of word lines in a first direction on a semiconductor substrate;
   forming an insulation layer on said plurality of word lines;
   forming a plurality of bit lines in a second direction perpendicular to said first direction on said insulation layer;
   forming a plurality of first and second power supply lines in said first direction on said plurality of bit lines, said first power supply lines being spaced-apart from said second power supply lines by a given distance;
   forming a plurality of column selecting lines in said second direction on said plurality of first and second power supply lines; and
   alternatively forming a plurality of third and fourth power supply lines in between said column selecting lines in said second direction, and for respectively connecting to said first and second power supply lines.

9. The method for fabricating a semiconductor memory device according to claim 8, wherein said first and third power supply lines are connected to a power supply voltage terminal having a first potential, and said second and fourth power supply lines are connected to a ground voltage terminal having a second potential.

10. A semiconductor memory device having a netlike power supply lines structure, comprising:
   a plurality of word lines arranged in a first direction on a semiconductor substrate;
   a plurality of bit lines arranged in a second direction perpendicular to said first direction, said plurality of bit lines being separated and spaced-apart from said plurality of word lines by an insulating layer;
   a plurality of first and second power supply lines arranged in said first direction on said plurality of bit lines, said first power supply lines being separated and spaced-apart from said second power supply lines by a given distance;
   a plurality of column selecting lines arranged in said second direction on said plurality of first and second power supply lines; and
   a plurality of third and fourth power supply lines, each disposed in between said column selecting lines in said second direction, and respectively connected to said first and second power supply lines.

11. The semiconductor memory device according to claim 10, wherein said first and third power supply lines are connected to a power supply voltage terminal having a first potential, and said second and fourth power supply lines are connected to a ground voltage terminal having a second potential.

12. A semiconductor memory device having a netlike power supply line structure, comprising:
   a plurality of bit lines arranged in columns on a substrate;
   a plurality of word lines arranged in rows on the substrate;
   a plurality of first and second power supply lines disposed in parallel with said plurality of bit lines; and
   a plurality of column select lines arranged in parallel with said plurality of bit lines, each of said column select lines being disposed between said first and second power supply lines.

13. The semiconductor memory device according to claim 12, wherein said first and second power supply lines are respectively connected to a power supply voltage terminal having a first potential and to a ground voltage terminal having a second potential.

14. The semiconductor memory device according to claim 12, wherein one of said first and second power supply lines is one of a power supply voltage terminal having a first potential and a ground voltage terminal having a second potential, and other one of said first and second power supply lines is an opposite one of said power supply voltage terminal having the first potential and said ground voltage terminal having the second potential.

15. The semiconductor memory device according to claim 12, wherein said first power supply line is a power supply voltage terminal having a first potential and said second power supply line is a ground voltage terminal having a second potential.

16. The semiconductor memory device according to claim 12, wherein said first power supply line is a ground voltage terminal and said second power supply line is a power supply voltage terminal.

17. The semiconductor memory device according to claim 12, wherein one of said first and second power supply lines is any one of a power supply voltage terminal having a first potential and a ground voltage terminal having a second potential, and other one of said first and second power supply lines is also any one of said power supply voltage terminal having the first potential and said ground voltage terminal having the second potential.

* * * * *